(12) United States Patent
Tobias et al.

(10) Patent No.: US 9,361,915 B1
(45) Date of Patent: Jun. 7, 2016

(54) METHOD FOR MAKING A DISK DRIVE HEAD SUSPENSION COMPONENT HAVING A MICROSTRUCTURED SURFACE REGION

(71) Applicant: Hutchinson Technology Incorporated, Hutchinson, MN (US)

(72) Inventors: Kyle T. Tobias, Hutchinson, MN (US); Lawrence E. LaLonde, Hutchinson, MN (US); Darrell C. Sydlo, Hutchinson, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 289 days.

(21) Appl. No.: 13/690,883

(22) Filed: Nov. 30, 2012

Related U.S. Application Data

(60) Provisional application No. 61/630,007, filed on Dec. 2, 2011.

(51) Int. Cl.
| | |
|---|---|
| *G11B 5/127* | (2006.01) |
| *H04R 31/00* | (2006.01) |
| *G11B 5/48* | (2006.01) |
| *G03F 7/20* | (2006.01) |
| *G11B 5/84* | (2006.01) |

(52) U.S. Cl.
CPC ............... *G11B 5/4853* (2013.01); *G03F 7/20* (2013.01); *G11B 5/4806* (2013.01); *G11B 5/84* (2013.01)

(58) Field of Classification Search
USPC ............ 29/603.03–603.07; 360/244.8, 244.2, 360/244, 240, 294.4–294.7; 451/5, 41
See application file for complete search history.

(56) References Cited

U.S. PATENT DOCUMENTS

| | | | |
|---|---|---|---|
| 5,589,255 A * | 12/1996 | Enomoto et al. ............. | 442/149 |
| 5,666,717 A | 9/1997 | Matsumoto et al. | |
| 5,839,193 A | 11/1998 | Bennin et al. | |
| 6,841,737 B2 | 1/2005 | Komatsubara et al. | |
| 6,891,700 B2 | 5/2005 | Shiraishi et al. | |
| 7,695,896 B2 * | 4/2010 | Hwang et al. ................. | 430/311 |
| 2009/0238956 A1* | 9/2009 | Kojima ........................ | 427/98.5 |
| 2012/0055697 A1 | 3/2012 | Okamoto | |

* cited by examiner

*Primary Examiner* — Paul D Kim
(74) *Attorney, Agent, or Firm* — Faegre Baker Daniels, LLP (57) ABSTRACT

A method for making a disk drive head suspension component having a microstructured surface region includes depositing a layer of photoimageable polymer having an associated set of process parameters including a minimum resolution and exposing the photoimageable polymer through a photomask having a microstructure-producing region with features below the minimum resolution for the photoimageable polymer. The exposed photoimageable polymer is developed to produce a layer of polymer having a thickness and a microstructured surface region with depressions that are less than the thickness of the polymer.

21 Claims, 7 Drawing Sheets

METHOD FOR MAKING A DISK DRIVE HEAD SUSPENSION COMPONENT HAVING A MICROSTRUCTURED SURFACE REGION

CROSS-REFERENCE TO RELATED APPLICATION

This application claims the benefit of U.S. Provisional Application No. 61/630,007, filed Dec. 2, 2011 and entitled Microstructure Patterned Surfaces For Integrated Lead Head Suspensions, which is herein incorporated by reference in its entirety.

TECHNICAL FIELD

The invention is an integrated lead or wireless head suspension or component, such as a flexure, having textured surfaces on the conductor layer, insulating layer and/or cover layer.

BACKGROUND OF THE INVENTION

Disk drive integrated lead head suspensions having a spring metal base layer, an insulating dielectric layer and conductor elements, such as traces or leads and electrical bond or termination pads, in a conductor layer are known and disclosed, for example in the Komatsubara et al. U.S. Pat. No. 6,841,737 and the Shiraishi et al. U.S. Pat. No. 6,891,700. These devices generally include a flexure mounted to a spring metal load beam. The flexure typically includes a spring metal layer with a plurality of conductors, leads or traces extending between terminal pads on opposite ends of the flexure. A layer of insulating material separates the traces from the underlying spring metal layer. A cover layer may be formed over portions of the traces so as to extend from the insulating layer up over the tops and sides of the traces.

Subtractive and/or additive processes can be used to manufacture these devices. Subtractive manufacturing processes as disclosed in, for example, the Bennin et al. U.S. Pat. No. 5,839,193 use photolithography and etching processes to form the flexure from laminate material stock having a spring metal layer and conductor layer separated by an insulating layer. Additive manufacturing processes as disclosed, for example, in the Matsumoto et al. U.S. Pat. No. 5,666,717 use photolithography, deposition and etching processes to add the insulating layer, conductor layer and other structures to the spring metal layer.

In one example of an additive manufacturing process, a photoimageable insulating layer (e.g., polyimide or other polymer) is deposited onto the spring metal base layer. A photolithography process is then used to pattern the insulating layer. Conductive elements such as traces and terminal pads are subsequently deposited onto the patterned insulating layer. In this manner, the deposited conductor elements follow the contour and surface topography of the patterned insulating layer. An insulating cover layer may subsequently be deposited onto certain areas of the conductor elements. Specific regions of the insulating layer may be removed such as by etching or other processes to expose both surfaces of the conductor layer to create, for example, flying termination leads, head termination pads or flying gimbal leads. The exposed surfaces of the flying leads and termination pads may be electrically connected to disk drive circuitry or magnetic head terminals through soldering or ultrasonic bonding processes.

There remains a need for integrated lead head suspensions providing improved interlayer adhesion, reduced tool wear, improved vision system inspection characteristics, and enhanced mechanical, thermal and aerodynamic performance. To be commercially viable, any such suspensions or suspension components must be capable of being efficiently manufactured.

SUMMARY

One embodiment of the invention is a method for making a disk drive head suspension component having a microstructured surface region. The method includes depositing a layer of photoimageable polymer having an associated set of process parameters including a minimum resolution and exposing the photoimageable polymer through a photomask having a microstructure-producing region with features below the minimum resolution for the photoimageable polymer. The exposed photoimageable polymer is developed to produce a layer of polymer having a thickness and a microstructured surface region with depressions that are less than the thickness of the polymer. In another embodiment of the invention, exposing the polymer through a photomask includes exposing the polymer through a photomask having a microstructure-producing region with features sized and spaced between about 1 μm and 10 μm. Embodiments of the invention can be used to produce microstructured surfaces on structures such as flying leads, flying termination pads, cover coat layers and at insulating layer-trace interfaces and insulating layer-cover coat interfaces.

DETAILED DESCRIPTION

Smooth conductor layer and insulating layer surfaces can lead to premature wear of ultrasonic bonding tips and poor adhesion and delamination between the insulating layer and conductor or cover layers. Head suspensions and head suspension components having microstructure patterned surface layers in accordance with the present invention can alleviate premature tool wear and adhesion problems. Embodiments of the present invention utilizes a unique photolithography imaging and exposing or patterning process in conjunction with known subtractive and additive manufacturing processes such as, for example, wet and dry etching, various deposition processes and laminated materials, to form microstructure patterned surfaces on the conductor, insulating and/or cover layers of the components.

Figure 1A:
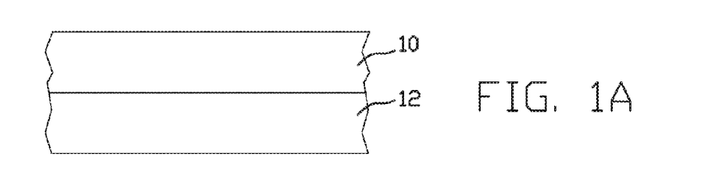
FIGS. 1A-1G are diagrammatic cross sectional illustrations of a head suspension structure showing a process for forming microstructured surfaces in accordance with one embodiment of the invention.
Figure 1B:
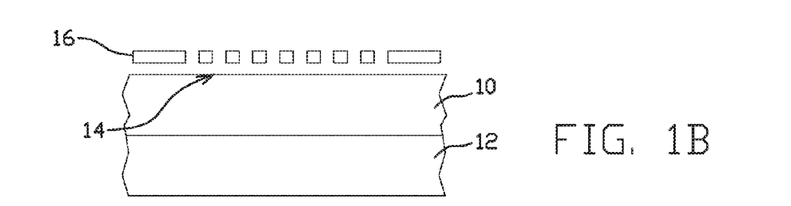
Figure 1C:
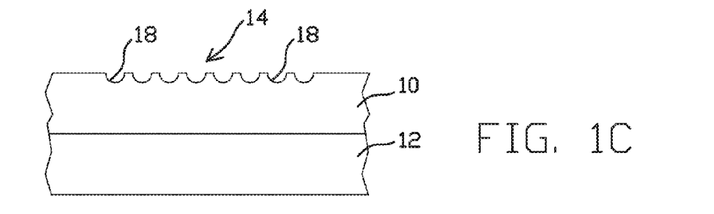

A method for making a disk drive head suspension component having microstructured surfaces such as head termination pads or flying termination leads in accordance with one embodiment of the invention can be described generally with reference to FIGS. 1A-1E. As shown in FIG. 1A, a photoimageable polymer such as insulating polyimide layer 10 is deposited onto the spring metal base layer 12. Regions 14 of the polyimide layer 10 coinciding with surfaces to be microstructured, such as the conductor termination pads or leads, are exposed through a mask 16 having light blocking or transmitting features below the minimum resolution for the photoimageable polyimide of layer 10 as shown in FIG. 1B. In one embodiment of the invention the light blocking or transmitting features are sized (e.g., diameter) and spaced (e.g., separated by) from between about 1 µm and 10 µm. After being exposed through the mask 16 the polyimide layer 10 is developed and cured or otherwise hardened as shown in FIG. 1C. By this process a microstructured region 14 having depressions 18 that are less than the thickness of the polyimide layer 10 is formed in the polyimide layer.

The minimum resolution defines the maximum size light blocking or transmitting features that will create patterned depressions 18 in predetermined regions of the polyimide 10 for a given set of material properties and process parameters. The polyimide will etch through when exposed through a mask having light blocking or transmitting features sized above the minimum resolution for the same set of material properties and process parameters. The minimum resolution is dependent on the thickness and material properties of the polyimide along with the exposing and developing processing times among other things. The remaining regions of the insulating polyimide layer are exposed through a mask having conventional light blocking or transmitting features. In this manner, microstructure patterned depressions 18 are formed in selected, predetermined regions 14 during the develop and cure cycles of the insulating polyimide layer 10 patterning process.

Figure 1D:
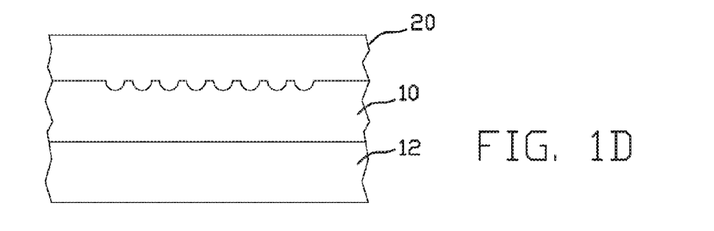
Figure 1E:
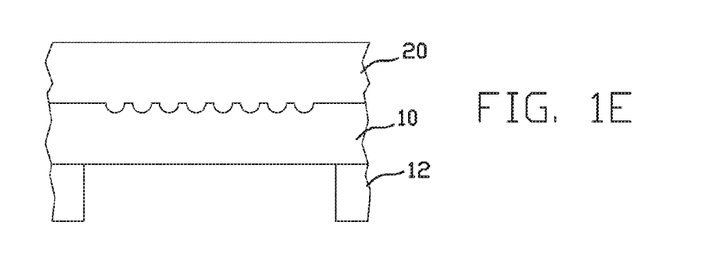
Figure 1F:
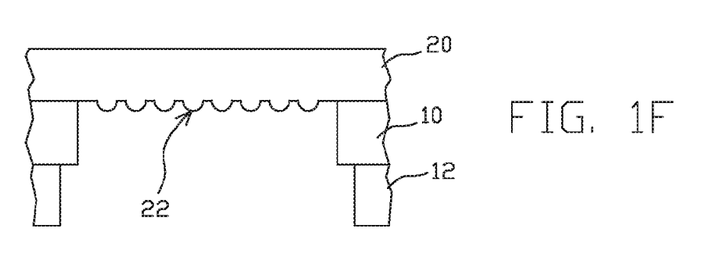
Figure 1G:
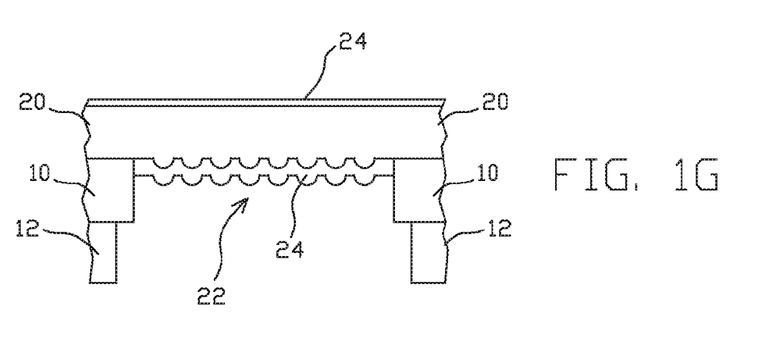

A conductive material layer 20 (typically copper or copper alloy) that can be formed into conductor elements such as traces or leads and termination or bond pads is deposited, using known methods (e.g., plating following seed layers), onto the patterned insulating layer 10 over the microstructure patterned depressions 18 as shown in FIG. 1D. Portions of the spring metal base layer 12 and the microstructure patterned insulation layer 10 can then be removed via etching, laser ablation or the like to expose the termination surfaces 22 of the conductive material layer 20 as shown in FIGS. 1E and 1F. A corrosion resistant material 24 such as nickel-gold can, but need not be, deposited onto the surfaces 22 of the conductive material layer 20 as shown in FIG. 1G.

The termination surfaces 22 of the conductor elements in the conductive material layer 20 include microstructure patterned raised areas formed by the patterned depressions 18 in the removed insulating layer 10. The microstructure patterned termination surfaces 22 increase the coefficient of friction between an ultrasonic bonding tool and the termination surfaces resulting in reduced slippage between the tool and termination surfaces thus decreasing tool wear. The microstructure patterned termination surfaces also concentrate the ultrasonic bonding tool tip force to a smaller effective area which increases the localized pressure during bonding and results in greater coupling between the bonding tool and the termination surfaces. The higher effective pressure at the surface can be achieved with lower bulk ultrasonic bonding tool aggressiveness which results in decreased tool wear for the same effective bonding robustness.

Figure 2:
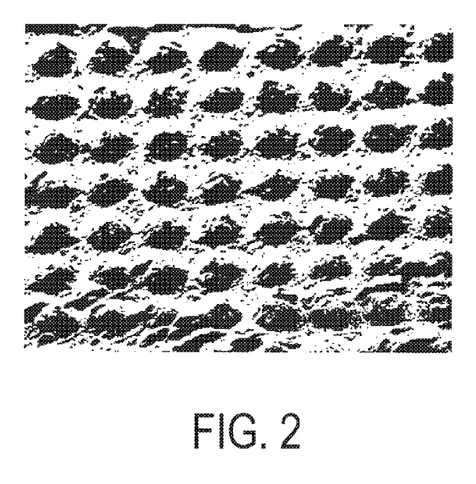
FIG. 2 is a magnified photograph of a microstructured surface in accordance with an embodiment of the invention.

FIG. 2 is an photograph of a magnified (500×) microstructured surface 22 in a conductive material layer 20 manufactured in accordance with the present invention using a photomask having 5 µm features.

Figure 3:
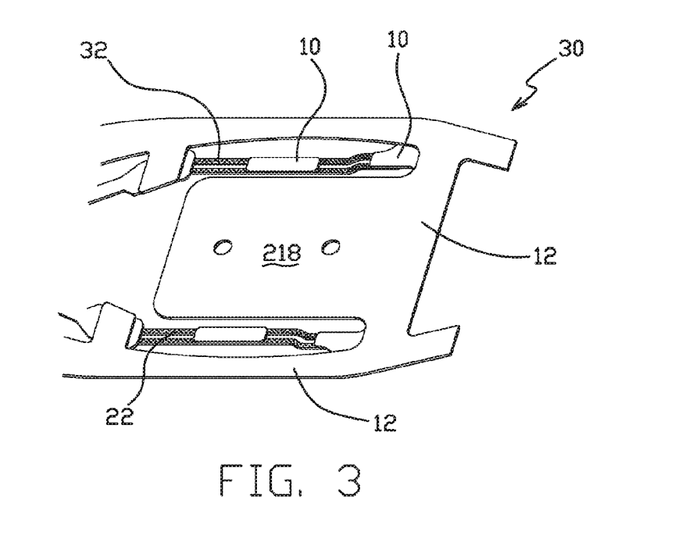
FIG. 3 is an isometric view of a head suspension gimbal including flying leads having microstructured surfaces in accordance with an embodiment of the invention.

FIG. 3 is an illustration of a gimbal 30 of a head suspension flexure having flying leads or traces 32 with microstructured surfaces 22 in accordance with an embodiment of the invention. Also shown in FIG. 3 are portions of the gimbal 30 formed from the polyimide layer 10 and the spring metal base layer 12. The microstructure patterned flying gimbal traces 32 provide improved aerodynamic performance. During operation of the disk drive, as the head suspension flies over the rotating disk, the microstructure pattern on the flying gimbal traces 32 causes the air flow over the leads to transition from laminar to turbulent which reduces the pressure drag and improves aerodynamic performance of the gimbal leads.

Figure 4:
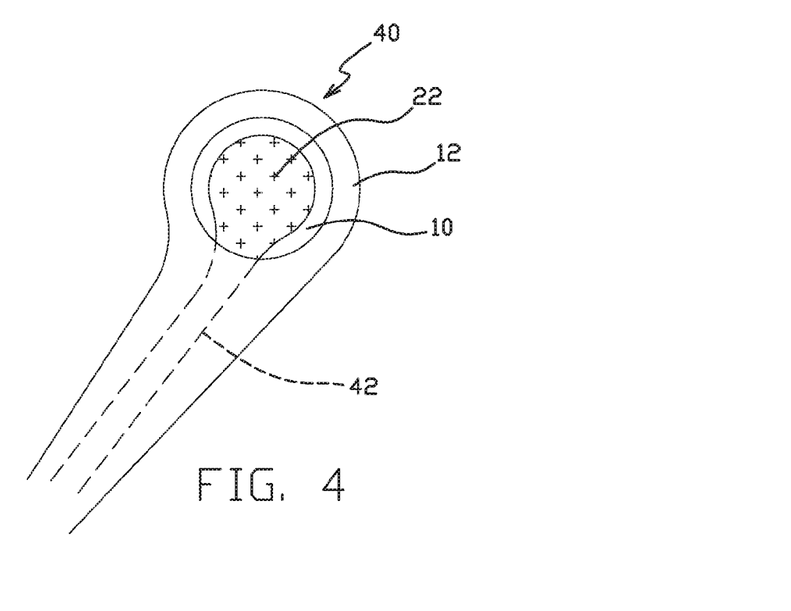
FIG. 4 is an illustration of a head suspension flexure dual stage actuator (DSA) paddle having a contact pad with a microstructured surface in accordance with an embodiment of the invention.

Another embodiment of the invention includes integrated lead flexures manufactured by additive and/or subtractive processes (e.g., a so-called TSA or TSA+ flexure) configured for use with dual stage actuated (DSA) suspensions having piezoelectric or other motors. The flexures include one or more traces terminating at contacts (also sometimes referred to as DSA paddles) configured for electrical interconnection to the DSA motors. Microstructure patterned surfaces of the types described above can be incorporated into the DSA contacts of this embodiment of the invention. FIG. 4, for example, is an illustration of a dual stage actuation (DSA) motor contact 40 of a head suspension flexure having a microstructured surface 22 in accordance with an embodiment of the invention. Also shown in FIG. 4 is a trace 42 extending from the contact 40 and portions of the contact formed from the polyimide layer 10 and the spring metal base layer 12.

Figure 5:
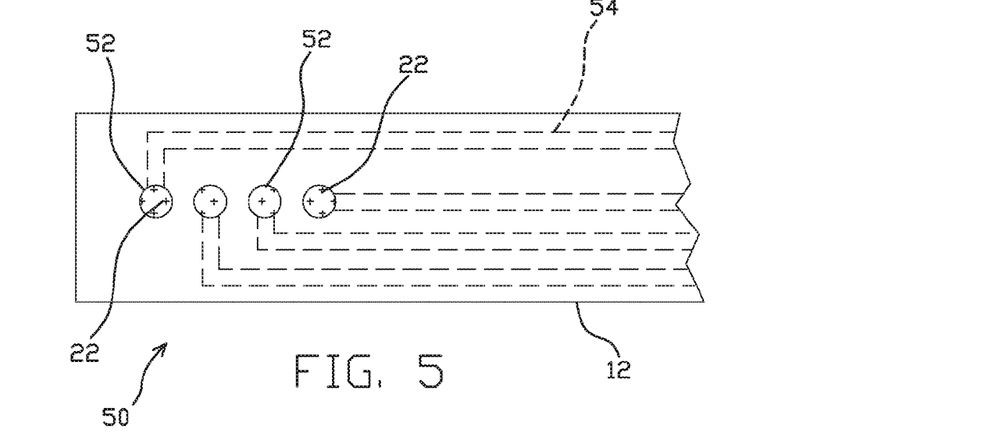
FIG. 5 is an illustration of a head suspension flexure tail having flying termination pads with microstructured surfaces in accordance with an embodiment of the invention.

FIG. 5 is an illustration of a tail 50 of a head suspension flexure having flying termination pads or contacts 52 with microstructured surfaces 22 in accordance with an embodiment of the invention. Also shown in FIG. 5 are the traces 54 extending from the contacts 52 and portions of the tail formed from the spring metal base layer 12. Still other embodiments of the invention include head suspension flexures having other contacts with microstructured surfaces, such as for example bond pads on the head suspension gimbal for connection to a read/write head on a slider. The microstructured surfaces can improve interfacial effects such as increased surface area for adhesion of non-ultrasonic bonds (e.g., solder, conductive epoxy, gold ball bonds, and the like). The roughness of the microstructured surface can also change the surface morphology to increase mechanical locking of the layers. The increased surface area and morphology can improve DSA paddle and other contact joint reliability. Similarly, other contact pads on traces of integrated lead flexures (e.g., those on the tail and gimbal) will benefit from this feature.

Figure 6A:
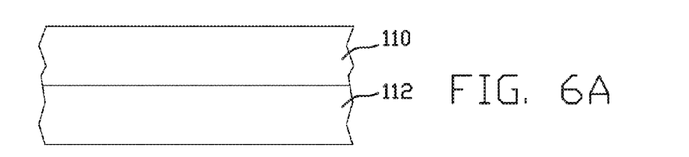
FIGS. 6A-6E are diagrammatic cross sectional illustrations of a head suspension structure showing a process for forming microstructured surfaces in accordance with another embodiment of the invention.
Figure 6B:
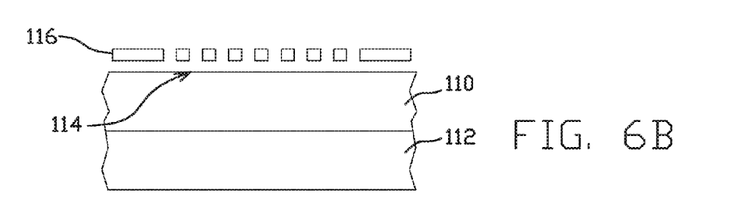
Figure 6C:
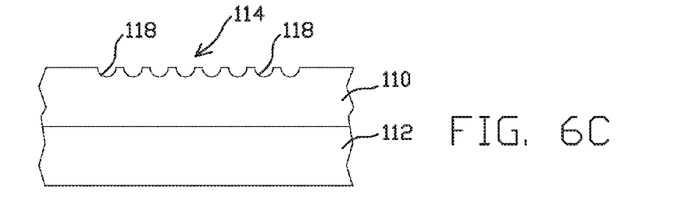

A method for making a disk drive head suspension component having microstructured surfaces in accordance with another embodiment of the invention that provides improved adhesion between the conductor element-insulating layer interface and between the cover layer-insulating layer interface can be described generally with reference to FIGS. 6A-6E. As shown in FIG. 6A, the photoimageable insulating polyimide layer 110 is deposited onto the spring metal base layer 112. Regions 114 of the polyimide layer 110 coinciding with surfaces to be microstructured such as the insulating layer-conductor elements interface and the cover layer-insulating layer interface are exposed through a mask 116 having light blocking or transmitting features below the minimum resolution for the photoimageable polyimide of layer 110 as shown in FIG. 6B. After being exposed through the mask 116 the polyimide layer 110 is developed and cured or otherwise hardened as shown in FIG. 6C. By this process a microstructured region 114 having depressions 118 that are less than the thickness of the polyimide layer 110 is formed in the polyimide layer.

The minimum resolution defines the maximum size light blocking or transmitting features that will create patterned depressions 118 in predetermined regions of the polyimide 110 for a given set of material properties and process parameters. The polyimide will etch through when exposed through a mask having light blocking or transmitting features sized above the minimum resolution for the same set of material properties and process parameters. The minimum resolution is dependent on the thickness and material properties of the polyimide along with the exposing and developing processing times among other things. The remaining regions of the insulating polyimide layer are exposed through a mask having conventional light blocking or transmitting features. In this manner, microstructure patterned depressions 118 are formed in selected, predetermined regions 114 during the develop and cure cycles of the insulating polyimide layer 110 patterning process.

Figure 6D:
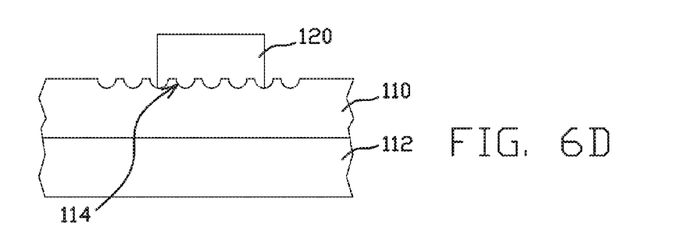
Figure 6E:
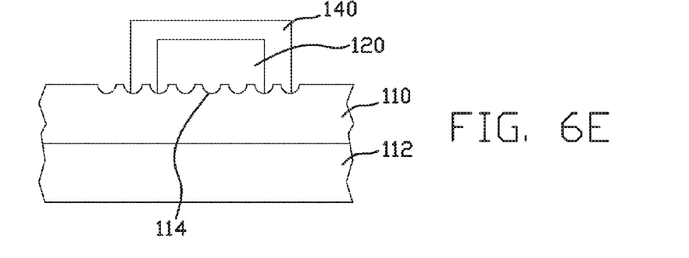

A conductive material layer 120 (typically copper or copper alloy) that can be formed into conductor elements such as traces or leads and termination or bond pads is deposited, using known methods (e.g., plating following seed layers), onto the patterned insulating layer 110 over the microstructure patterned depressions 118 as shown in FIG. 6D. A photoimageable cover layer 140 can be deposited and patterned to extend from the microstructure patterned insulating layer 110 over the tops and sides of the conductor elements in the conductive material layer 120 as shown in FIG. 6E. In an alternate embodiment (not shown), the microstructure patterned depressions are formed only in regions of the insulating polyimide layer coinciding with the conductor element-insulating layer interface. The microstructure patterned insulating layer creates a stronger bond to the conductor elements and/or cover layer.

Figure 7:
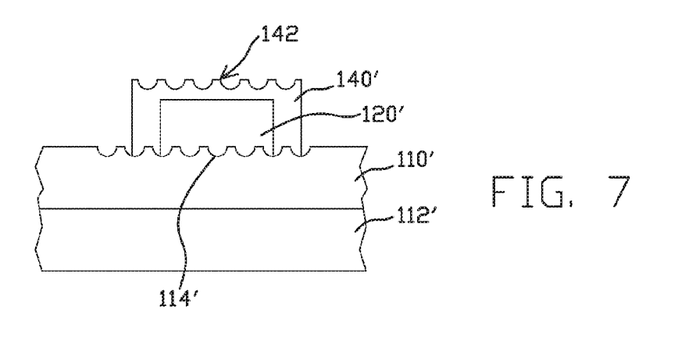
FIG. 7 is a diagrammatic cross sectional illustration of a head suspension flexure trace having a microstructured insulating layer-trace interface and a microstructured covercoat in accordance with an embodiment of the invention.

FIG. 7 is an illustration of an embodiment that is similar to the embodiment described above, except that the photoimageable cover layer 140' is exposed through a mask having light blocking or transmitting features sized and spaced below the minimum resolution of the photoimageable cover layer, e.g., from e.g., between about 1 µm and 10 µm. The resulting cover layer 140' has a matte finish 142 which provides for increased vision inspection yields by reducing false rejects of otherwise functional product due to cosmetic blemishes.

Figure 8:
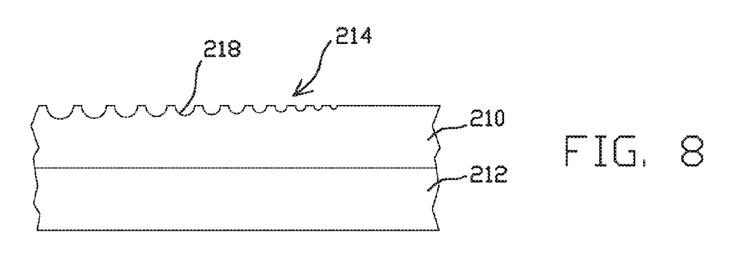
FIG. 8 is a diagrammatic cross sectional illustration of a head suspension flexure having a microstructured insulating layer with varying depression sizes in accordance with an embodiment of the invention.

Another embodiment utilizes the microstructure patterning process to control mechanical properties such as stiffness by modifying the insulating layer in selected, predetermined regions of the suspension. For example, it may be desirable to modify the stiffness in the gimbal and/or hinge regions of the head suspension by controlling the amount of the insulating layer in these regions. The insulating layer could be transitioned from regions having, for example, 1 µm microstructure patterns (more stiffness) to regions having, for example, 10 µm microstructure patterns (less stiffness). The transition from larger to smaller microstructure patterns may be gradual or in discreet steps. By way of example, FIG. 8 is an illustration of a polyimide layer 210 microstructured region 214 having depressions 218 of continuously varying depth.

Embodiments of the invention include an integrated lead suspension having a spring metal base layer, a conductor layer and an insulation layer between the spring metal base and conductor layers. The conductor layer includes at least one lead having at least one microstructure patterned termination surface. In another embodiment of the invention, the integrated lead suspension further includes a cover layer extending from the insulating layer over the conductor layer. The insulating layer includes microstructure patterned surfaces at the lead to insulating layer interface and/or at the cover layer to insulating layer interface. In yet another embodiment of the invention, the integrated lead suspension further includes a cover layer extending from the insulating layer over the conductor layer. The cover layer includes a microstructure patterned matte surface finish. In still another embodiment of the invention, the integrated lead suspension further includes flying gimbal leads having microstructure patterned surfaces. In another embodiment of the invention, the insulating layer includes microstructure patterned regions of varying size, spacing and depth.

Advantages provided by this invention include microstructure patterned lead termination regions that reduce wear of ultrasonic bonding tools; microstructure patterned insulating layer regions that improve adhesion and provide tailored mechanical properties; microstructure patterned cover layer regions that improve machine vision inspection; and, microstructure patterned leads that improve aerodynamic performance.

Although the present invention is described and shown with reference to preferred embodiments, those skilled in the art will recognize that changes can be made in form and detail without departing from the spirit and scope of the invention. For example, the microstructure patterns may have rectangular, triangular, oval or other shapes. Other embodiments of the invention can have other combinations of the microstructure patterned features described above.

The invention claimed is:

1. A method for making a disk drive head suspension component having a microstructured surface region, comprising:
   depositing a layer of photoimageable polymer having an associated set of process parameters including a minimum resolution;
   exposing the photoimageable polymer through a photomask having a microstructure-producing region with features sized and spaced between about 1 µm and 10 µm and below the minimum resolution for the photoimageable polymer; and
   developing the exposed photoimageable polymer to produce a layer of polymer having a thickness and a microstructured surface region having depressions that are less than the thickness of the polymer; and
   curing the developed polymer.

2. The method of claim 1, further comprising a step of curing the developed polymer.

3. The method of claim 1 wherein:
   exposing the polymer through a photomask includes exposing the polymer through a photomask having a range of features below the minimum resolution for the polymer; and
   developing the polymer produces a layer of polymer having varying size depressions that are less than the thickness of the polymer.

4. A method for making a disk drive head suspension component having a microstructured surface region, comprising:
 depositing a layer of photoimageable polymer having an associated set of process parameters including a minimum resolution;
 exposing the photoimageable polymer through a photomask having a microstructure-producing region with features below the minimum resolution for the photoimageable polymer; and
 developing the exposed photoimageable polymer to produce a layer of polymer having a thickness and a microstructured surface region having depressions that are less than the thickness of the polymer;
 wherein depositing the layer of photoimageable polymer includes depositing the layer of polymer on a layer of conductive material formed into a trace; and
 wherein the microstructured surface region is over the trace.

5. A method for making a disk drive head suspension component having a microstructured surface region, comprising:
 depositing a layer of photoimageable polymer having an associated set of process parameters including a minimum resolution;
 exposing the photoimageable polymer through a photomask having a microstructure-producing region with features below the minimum resolution for the photoimageable polymer; and
 developing the exposed photoimageable polymer to produce a layer of polymer having a thickness and a microstructured surface region having depressions that are less than the thickness of the polymer; and
 depositing a layer of conductive material on the microstructured surface region of the polymer to produce a microstructured surface on the conductive material at a polymer-conductive material interface.

6. The method of claim 5, further comprising a step of forming the layer of conductive material into one or more of a trace and a connector pad.

7. The method of claim 6, further comprising a step of depositing a photoimageable cover layer over the trace and over microstructured portions of the polymer adjacent the trace.

8. The method of claim 5 wherein:
 depositing the layer of photoimageable polymer includes depositing the layer of photoimageable polymer onto a spring metal layer; and
 the method further includes etching the spring metal layer and microstructured polymer layer to expose the microstructured surface of the conductive material.

9. The method of claim 8, further comprising a step of forming the layer of conductive material into one or more of a flying trace and a connector pad having a microstructured surface.

10. A method for making a disk drive head suspension component having a microstructured surface region, comprising:
 depositing a layer of photoimageable polymer having an associated set of process parameters including a minimum resolution;
 exposing the photoimageable polymer through a photomask having a microstructure-producing region with features below the minimum resolution for the photoimageable polymer;
 developing the exposed photoimageable polymer to produce a layer of polymer having a thickness and a microstructured surface region having depressions that are less than the thickness of the polymer;
 depositing a layer of conductive material on the microstructured surface region of the polymer to produce a microstructured surface on the conductive material at a polymer-conductive material interface; and
 forming the layer of conductive material into one or more of a trace and a connector pad.

11. The method of claim 10, further comprising a step of curing the developed polymer.

12. The method of claim 10 wherein exposing the polymer through a photomask includes exposing the polymer through a photomask having a microstructure-producing region with features between about 1 μm and 10 μm.

13. The method of claim 10 wherein exposing the polymer through a photomask includes exposing the polymer through a photomask having a microstructure-producing region with features sized and spaced below the minimum resolution for the photoimageable polymer.

14. The method of claim 13 wherein exposing the polymer through a photomask includes exposing the polymer through a photomask having a microstructure-producing region with features sized and spaced between about 1 μm and 10 μm.

15. The method of claim 14, further comprising a step of curing the developed polymer.

16. A method for making a disk drive head suspension component having a microstructured surface region, comprising:
 depositing a layer of photoimageable polymer onto a spring metal layer, wherein the photoimageable polymer has an associated set of process parameters including a minimum resolution;
 exposing the photoimageable polymer through a photomask having a microstructure-producing region with features below the minimum resolution for the photoimageable polymer;
 developing the exposed photoimageable polymer to produce a layer of polymer having a thickness and a microstructured surface region having depressions that are less than the thickness of the polymer;
 depositing a layer of conductive material on the microstructured surface region of the polymer to produce a microstructured surface on the conductive material at a polymer-conductive material interface;
 forming the layer of conductive material into one or more of a trace and a termination pad; and
 etching the spring metal layer and microstructured polymer layer to expose the microstructured surface of the conductive material and form one or more of a flying trace and a flying termination pad.

17. The method of claim 16, further comprising a step of curing the developed polymer.

18. The method of claim 16 wherein exposing the polymer through a photomask includes exposing the polymer through a photomask having a microstructure-producing region with features between about 1 μm and 10 μm.

19. The method of claim 16 wherein exposing the polymer through a photomask includes exposing the polymer through a photomask having a microstructure-producing region with features sized and spaced below the minimum resolution for the photoimageable polymer.

20. The method of claim 19 wherein exposing the polymer through a photomask includes exposing the polymer through a photomask having a microstructure-producing region with features sized and spaced between about 1 μm and 10 μm.

21. The method of claim 20, further comprising a step of curing the developed polymer.

* * * * *